(12) United States Patent
Zhang et al.

(10) Patent No.: US 11,783,590 B2
(45) Date of Patent: Oct. 10, 2023

(54) METHOD, APPARATUS, DEVICE AND MEDIUM FOR CLASSIFYING DRIVING SCENARIO DATA

(71) Applicant: Baidu Online Network Technology (Beijing) Co., Ltd., Beijing (CN)

(72) Inventors: Junfei Zhang, Beijing (CN); Chen Yang, Beijing (CN); Qingrui Sun, Beijing (CN); Jiming Mao, Beijing (CN); Fangfang Dong, Beijing (CN)

(73) Assignee: APOLLO INTELLIGENT DRIVING TECHNOLOGY (BEIJING) CO., LTD., Beijing (CN)

(*) Notice: Subject to any disclaimer, the term of this patent is extended or adjusted under 35 U.S.C. 154(b) by 1245 days.

(21) Appl. No.: 16/353,878

(22) Filed: Mar. 14, 2019

(65) Prior Publication Data
US 2019/0378035 A1    Dec. 12, 2019

(30) Foreign Application Priority Data

Jun. 11, 2018 (CN) .......................... 201810597956.2

(51) Int. Cl.
*G06N 20/00* (2019.01)
*G06N 5/046* (2023.01)
(Continued)

(52) U.S. Cl.
CPC ............ *G06V 20/56* (2022.01); *G06F 16/285* (2019.01); *G06F 30/20* (2020.01); *G06N 5/046* (2013.01);
(Continued)

(58) Field of Classification Search
None
See application file for complete search history.

(56) References Cited

U.S. PATENT DOCUMENTS

| 9,760,090 B2 * | 9/2017 | Shashua ........... G08G 1/096805 |
| 10,543,853 B2 * | 1/2020 | Toyoda ................. B60W 40/09 |
| 10,963,741 B2 * | 3/2021 | Ambeck-Madsen ........................ G06V 10/454 |

FOREIGN PATENT DOCUMENTS

| CN | 102169631 A | 8/2011 |
| CN | 103247291 A | 8/2013 |

(Continued)

OTHER PUBLICATIONS

Xu, Huazhe, et al. "End-to-end learning of driving models from large-scale video datasets." Proceedings of the IEEE conference on computer vision and pattern recognition. 2017. (Year: 2017).*

(Continued)

*Primary Examiner* — Daniel T Pellett
(74) *Attorney, Agent, or Firm* — Cozen O'Connor (57) ABSTRACT

Embodiments of a method, apparatus, device and computer readable storage medium for classifying driving scenario data includes: acquiring a first driving scenario data set from a crowdsourcing platform, driving scenario data in the first driving scenario data set having been classified; generating a driving scenario classification model at least based on the first driving scenario data set, for classifying driving scenario data collected by a collection entity; acquiring a rule for classifying the driving scenario data, the rule is generated based on a result of classifying the driving scenario data collected by the collection entity using the driving scenario classification model; updating the driving scenario classification model at least based on the rule.

22 Claims, 6 Drawing Sheets

(51) Int. Cl.
    *G06V 20/56*     (2022.01)
    *G06F 16/28*     (2019.01)
    *G06F 30/20*     (2020.01)
    *G06V 10/94*     (2022.01)
    *G05D 1/02*     (2020.01)

(52) U.S. Cl.
    CPC ........... *G06N 20/00* (2019.01); *G06V 10/945* (2022.01); *G05D 1/0221* (2013.01); *G05D 2201/0213* (2013.01)

(56) References Cited

FOREIGN PATENT DOCUMENTS

| | | |
|---|---|---|
| CN | 106682681 A | 5/2017 |
| CN | 107247972 A | 10/2017 |
| CN | 107609602 A | 1/2018 |
| CN | 107622281 A | 1/2018 |
| JP | 2011123552 A | 6/2011 |

OTHER PUBLICATIONS

Chinese Patent Application No. 201810597956.2, First Office Action dated Apr. 27, 2020 with English translation, 26 pages.
Han, Deep Learning Based Scene Recognition for Autonomous Driving, 96 pages.
Zhu et al., An overview of driving scenarios research and development applications, China Academic Journal Electronic Publishing House, 3 pages.
Ess et al. (2008) "Segmentation-Based Urban Traffic Scene Understanding," Toyota Motor Corporation and the EU projects Dirac (IST-027787) and Europa (ICT-2008-231888), 11 pp.
Xue et al. (2018) "A Survey of Scene Understanding by Event Reasoning in Autonomous Driving," International Journal of Automation and Computing, 15(3), pp. 249-266.
Japanese Patent Application No. 2019-047118 Decision to Grant dated Apr. 19, 2022, 3 pages.
English Translation of Japanese Patent Application No. 2019-047118 Decision to Grant dated Apr. 19, 2022, 2 pages.

* cited by examiner

METHOD, APPARATUS, DEVICE AND MEDIUM FOR CLASSIFYING DRIVING SCENARIO DATA

CROSS-REFERENCE TO RELATED APPLICATIONS

This application claims priority to Chinese Patent Application No. 201810597956.2, filed with the China National Intellectual Property Administration (CNIPA) on Jun. 11, 2018, the content of which is incorporated herein by reference in its entirety.

TECHNICAL FIELD

Embodiments of the present disclosure generally relate to the field of data processing, and specifically to a method, apparatus, device and computer readable storage medium for classifying driving scenario data.

BACKGROUND

The autonomous driving simulation technology refers to simulating a real driving environment in software, and evaluating the performance of an autonomous driving algorithm by causing a conveyance carrying the autonomous driving algorithm to interact with the simulated driving environment. In order to be able to achieve a comprehensive evaluation on the performance of the autonomous driving algorithm, the simulated driving environment should cover as many scenarios as possible in an actual driving course.

In general, driving scenario data may be collected by a collection entity such as a collection vehicle. The collected driving scenario data may be provided to an autonomous driving simulation system for simulating the real driving environment. Since the driving scenario data collected by the collection entity is usually massive, it is desired to classify the collected driving scenario data before the data is provided to the autonomous driving simulation system, so that the provided driving scenario data can cover various types of scenarios during the actual driving course, or a certain type of driving scenario can be provided to the autonomous driving simulation system.

SUMMARY

According to embodiments of the present disclosure, a solution for classifying driving scenario data is provided.

In a first aspect of the present disclosure, a method for determining a driving scenario classification model is provided. The method includes: acquiring a first driving scenario data set from a crowdsourcing platform. Driving scenario data in the first driving scenario data set has been classified. The method further includes: generating a driving scenario classification model at least based on the first driving scenario data set, for classifying driving scenario data collected by a collection entity. The method further includes: acquiring a rule for classifying driving scenario data. The rule is generated based on a result of classifying the driving scenario data collected by the collection entity using the driving scenario classification model. In addition, the method further includes: updating the driving scenario classification model at least based on the rule.

In a second aspect of the present disclosure, a method for classifying driving scenario data is provided. The method includes: acquiring first driving scenario data collected by a collection entity. The method further includes: classifying the first driving scenario data using a driving scenario classification model. The driving scenario classification model is generated based on a first driving scenario data set from a crowdsourcing platform. In addition, the method further includes: providing a result of classifying the first driving scenario data for a user, to cause the user to generate a rule for classifying driving scenario data based on the result, the rule being at least used to update the driving scenario classification model.

In a third aspect of the present disclosure, an apparatus for determining a driving scenario classification model is provided. The apparatus includes: a data acquiring module, configured to acquire a first driving scenario data set from a crowdsourcing platform, driving scenario data in the first driving scenario data set having been classified; a model generating module, configured to generate a driving scenario classification model at least based on the first driving scenario data set, to be used for classifying driving scenario data collected by a collection entity; a rule acquiring module, configured to acquire a rule for classifying driving scenario data, the rule being generated based on a result of classifying the driving scenario data collected by the collection entity using the driving scenario classification model; and a model updating module, configured to update the driving scenario classification model at least based on the rule.

In a fourth aspect of the present disclosure, an apparatus for classifying driving scenario data is provided. The apparatus includes: a first scenario acquiring module, configured to acquire first driving scenario data collected by a collection entity; a first scenario classifying module, configured to classify the first driving scenario data using a driving scenario classification model, the driving scenario classification model being generated based on a first driving scenario data set from a crowdsourcing platform; and a result providing module, configured to provide a result of classifying the first driving scenario data for a user, to cause the user to generate a rule for classifying driving scenario data based on the result, the rule being at least used to update the driving scenario classification model.

In a fifth aspect of the present disclosure, an electronic device is provided. The electronic device includes: one or more processors; and a storage device. The storage device is configured to store one or more programs. The one or more programs, when executed by the one or more processors, cause the one or more processors to implement the method according to the first aspect of the present disclosure.

In a sixth aspect of the present disclosure, an electronic device is provided. The electronic device includes: one or more processors; and a storage device. The storage device is configured to store one or more programs. The one or more programs, when executed by the one or more processors, cause the one or more processors to implement the method according to the second aspect of the present disclosure.

In a seventh aspect of the present disclosure, a computer readable medium storing a computer program is provided. The computer program, when executed by a processor, implements the method according to the first aspect of the present disclosure.

In an eighth aspect of the present disclosure, a computer readable medium storing a computer program is provided. The computer program, when executed by a processor, implements the method according to the second aspect of the present disclosure.

It should be understood that the contents described in the present disclosure are not intended to limit crucial or essential features of the embodiments of the present disclosure, and not used to limit the scope of the present disclosure. Other features of the present disclosure will be easily understood through the following descriptions.

BRIEF DESCRIPTION OF THE DRAWINGS

The above and other features, advantages and aspects of embodiments of the present disclosure will become more apparent in combination with the accompanying drawings and with reference to the following detailed descriptions. In the accompanying drawings, the same or similar reference numerals represent the same or similar elements.

DETAILED DESCRIPTION OF EMBODIMENTS

Embodiments of the present disclosure will be described in more detail below with reference to the accompanying drawings. Certain embodiments of the present disclosure are shown in the accompanying drawings. However, it should be appreciated that the present disclosure may be implemented in various forms, and should not be interpreted as being limited by the embodiments described herein. Conversely, the embodiments are provided for a more thorough and complete understanding for the present disclosure. It should be understood that the accompanying drawings and embodiments in the present disclosure are only illustrative, and not used to limit the scope of protection of the present disclosure.

In the description of the embodiments of the present disclosure, the term "include/including" and similar terms thereof should be understood as open-ended (i.e., "including, but not limited to"). The term "based on" should be understood as "at least partially based on." The term "an embodiment" or "the embodiment" should be understood as "at least one embodiment." The terms "first," "second," and the like may refer to different or identical objects. Other explicit and implicit definitions may also be included hereinafter.

As mentioned above, it is desired to classify the driving scenario data collected by a collection entity, and thus the driving scenario data capable of covering various types of scenarios in an actual driving course can be provided to an autonomous driving simulation system, or a certain type of driving scenario can be provided to the autonomous driving simulation system.

In some traditional solutions, scenario data may be simply classified as per dimensions such as a driving behavior and a geographic element. However, such a classification is usually not precise enough. For example, when the scenario data includes information of a plurality of dimensions, accurate classification of the scenario data is generally difficult to be realized. In other traditional solutions, a scenario classification model may be trained using a machine learning method, to achieve the classification of the scenario data. However, since it is difficult to provide a complete training sample, the overall distribution of scenario categories continuously changes as the number of training samples increases, resulting in a poor generalization performance of the trained model, for example, the model shows a good performance on the training sample, but a poor performance in the actual application.

According to the embodiments of the present disclosure, a solution for classifying driving scenario data is provided. The solution involves annotating a category of the scenario data through a crowdsourcing platform, and selecting, from the scenario data, representative scenario data as training samples for training the scenario classification model. The solution further involves classifying the scenario data collected by the collection entity using the trained scenario classification model, and providing the classification result to the user, to enable the user to create a rule for classifying the scenario data based on the classification result. The created rule is then applied to the crowdsourcing platform to improve the annotation quality of the training sample. In addition, the created rule is also applied to the model training process, to improve the training quality of the scenario classification model.

The solution according to the embodiments of the present disclosure can solve the above problems or other potential problems existing in the traditional scenario classification solutions by combining the crowdsourcing, the rule created by the user, and the machine learning technique. Therefore, the solution can be widely applied to various driving simulation systems and/or driving training systems, thereby realizing an effective evaluation on an autonomous driving algorithm.

The embodiments of the present disclosure will be specifically described below with reference to the accompanying drawings. In this specification, the term "model" may learn the association between the corresponding input and output from the training data. Thus, the model may generate the corresponding output for a given input after completing the training. It should be understood that the "model" may also be referred to as "neural network," "learning model," or "learning network." In addition, the term "driving scenario" may include, but not limited to, a vehicle driving scenario, an airplane driving scenario, a steamship driving scenario, or a driving scenario of any other conveyance, which may be expressed by information (also referred to as "driving scenario data" herein) related to the driving scenario within a certain period of time. Hereinafter, the embodiments of the present disclosure will be discussed by taking the vehicle driving scenario as an example. However, it should be understood that this is merely for the purpose of illustration, and is not intended to limit the scope of the present disclosure. The embodiments of the present disclosure may also be similarly applied to driving scenarios of other conveyance.

Figure 1:
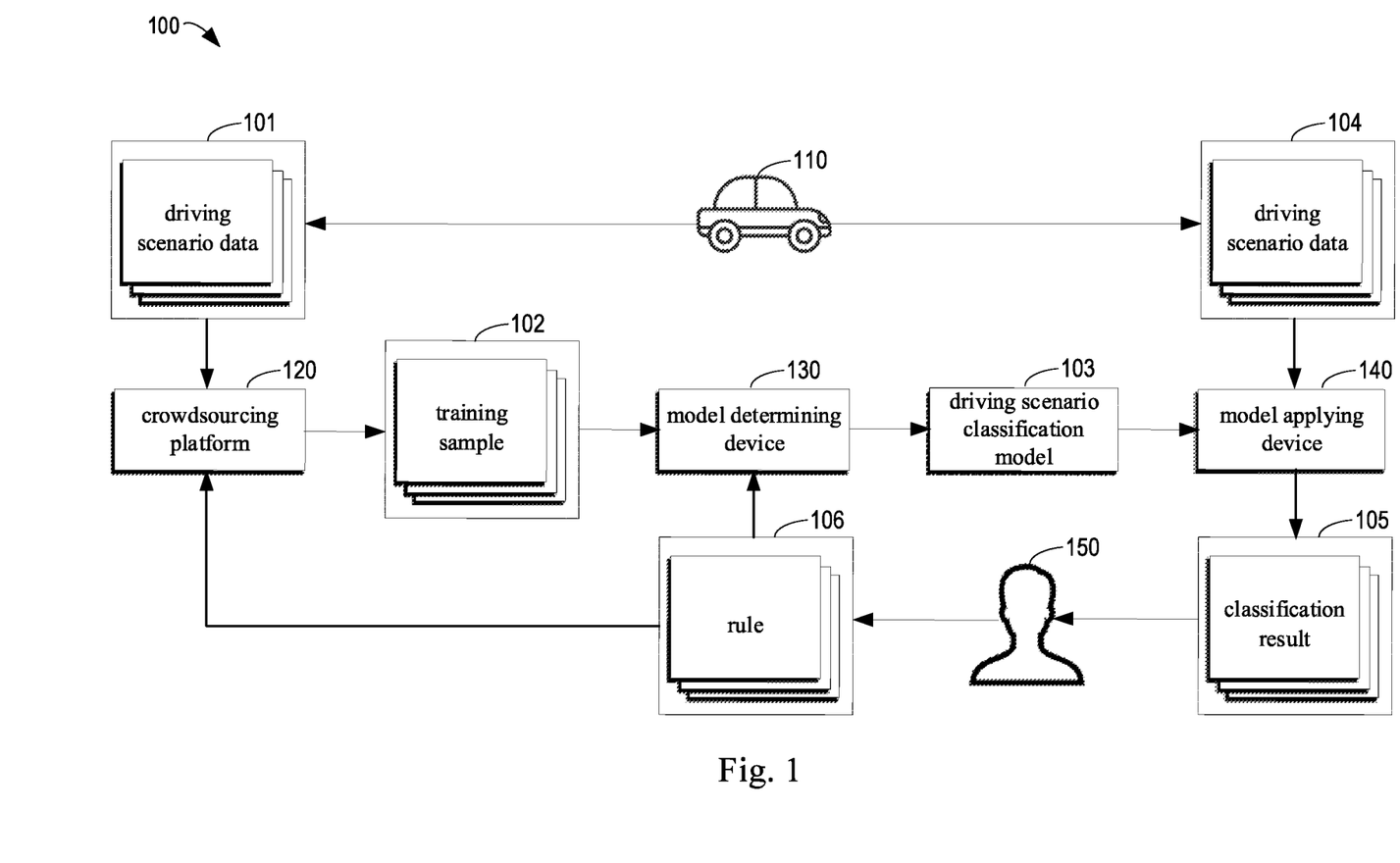
FIG. 1 is a schematic diagram of an exemplary environment in which embodiments of the present disclosure can be implemented.

FIG. 1 is a schematic diagram of an exemplary environment 100 in which embodiments of the present disclosure can be implemented. In general, the environment 100 may include a crowdsourcing platform 120, a model determining device 130, and a model applying device 140. It should be understood that the structure and the function of the environment 100 are described only for the illustrative purpose, and do not imply any limitation to the scope of the disclosure. The embodiments of the present disclosure may also be applied to environments having different structures and/or functions.

As shown in FIG. 1, a large amount of driving scenario data 101 collected by one or more collection entities 110 may be provided to the crowdsourcing platform 120 for classification.

Here, the "collection entity" may refer to any conveyance or other entities used to collect the driving scenario data, for example, a vehicle, a steamship and an aircraft for collecting data, but the collection entity is not limited thereto. For the illustrative purpose only, in this specification, the vehicle is used as an example of the collection entity. However, it should be understood that the embodiments of the present disclosure may also be applicable to other collection entities. Here, the "crowdsourcing platform" refers to a platform for publishing a work task (e.g., annotating categories of-the large amount of driving scenario data) to, for example, the Internet, to hand over the work task to a large number of non-specific individuals to complete.

In some embodiments, the driving scenario data 101 collected by the collection entity 110 may include all of the information collected by the collection entity 110 during a collection time period, including, but not limited to, information related to a road (e.g., information related to a road type, a road identifier and an obstacle on the road), information related to a traffic signal (e.g., a traffic signal light, various traffic signs, and a command from a traffic police), information related to a behavior of the collection entity 110 (e.g., following, overtaking and lane merging) and information collected by various sensors (e.g., a camera, an accelerometer and a gyroscope) installed on the collection entity 110 (e.g., information related to surrounding entities). In some embodiments, at the crowdsourcing platform 120, the driving scenario data 101 may be classified as per a geographic element, a traffic signal and/or a driving behavior associated with the driving scenario data, for example, an intersection scenario, a red light scenario, an overtaking scenario and a lane changing scenario. In addition, a set of representative driving scenario data may be selected from the classified driving scenario data as the training sample 102 for training the driving scenario classification model.

As shown in FIG. 1, the training sample 102 may be provided to the model determining device 130 for training the driving scenario classification model 103. For example, the driving scenario classification model 103 may be trained based on the training sample 102 using a machine learning method. The trained driving scenario classification model 103 may be provided to the model applying device 140, for classifying the driving scenario data 104 collected by the collection entity 110.

The driving scenario data 101 and the driving scenario data 104 are illustrated as being collected by the same collection entity 110 in FIG. 1. However, it should be understood that this is only for purposes of illustration and simplicity. In some embodiments, the driving scenario data 101 and the driving scenario data 104 may be respectively collected by different collection entities. For example, in some embodiments, the driving scenario data collected by a collection entity may be provided to the crowdsourcing platform 120 for category annotation, and the driving scenario classification model 103 is trained using a set of annotated driving scenario data. The trained driving scenario classification model 103 may be used to classify the driving scenario data collected by another collection entity.

As shown in FIG. 1, by classifying the driving scenario data 104 using the driving scenario classification model 103, the model applying device 140 may generate a classification result 105. The classification result 105 may indicate the category to which the driving scenario data 104 belongs. For example, the category of the driving scenario data 104 may be a category related to the geographic element, the traffic signal, and/or the driving behavior, for example, the intersection scenario, the red light scenario, the overtaking scenario and the lane changing scenario. The model applying device 140 may further provide the classification result 105 for a user 150.

The user 150 may evaluate the classification result 105. For example, the user 150 may determine whether the classification result 105 is accurate based on experience. Based on the evaluation on the classification result 105, the user 150 may further formulate a rule 106 for classifying the scenario data. For example, the user 150 may formulate a more specific classification rule for an inaccurately classified scenario presenting in the classification result 105, to make the classification result more consistent with the expectation of the user 150.

In some embodiments, as shown in FIG. 1, the evaluation on the classification result 105 and the formulation of the rule 106 may be completed by the same user. Alternatively, in other embodiments, the evaluation on the classification result 105 and the formulation of the rule 106 may also be completed by different users. For example, the driving scenario classification result 105 may be provided to a user who is about to use the classified driving scenario data to implement the autonomous driving simulation. The user may evaluate the driving scenario classification result 105 and provide the evaluation for an industry expert. The industry expert may uniformly formulate the rule 106 based on the evaluations from different users. In some embodiments, the rule 106 may indicate how should certain driving scenarios (e.g., the result of the driving scenario classification model classifying the driving scenarios is inconsistent with the result expected by the user) be classified. The rule 106 will be further described in detail below in combination with FIG. 4.

As shown in FIG. 1, the rule 106 may be provided and applied to the crowdsourcing platform 120. For example, at the crowdsourcing platform 120, subsequently received driving scenario data may be classified and annotated according to the rule 106, and a corresponding training sample may be generated. In this way, a training sample more consistent with the expectation of the user 150 may be generated. The training sample generated according to the rule 106 may be further used to update the previously generated driving scenario classification model 103.

Moreover, the rule 106 may also be provided and applied to the model determining device 130. For example, the model determining device 130 may perform subsequent training and updating on the model based on rule 106. In particular, the model determining device 130 may update the previously generated driving scenario classification model 103 based on both the training sample generated according to the rule 106 from the crowdsourcing platform 120 and the rule 106. In this way, the generalization performance of the generated driving scenario classification model 103 can be improved, thereby achieving a more accurate classification for the driving scenario data.

The working principles of the model determining device 130 and the model applying device 140 shown in FIG. 1 will be described in detail below with reference to the accompanying drawings.

Figure 2:
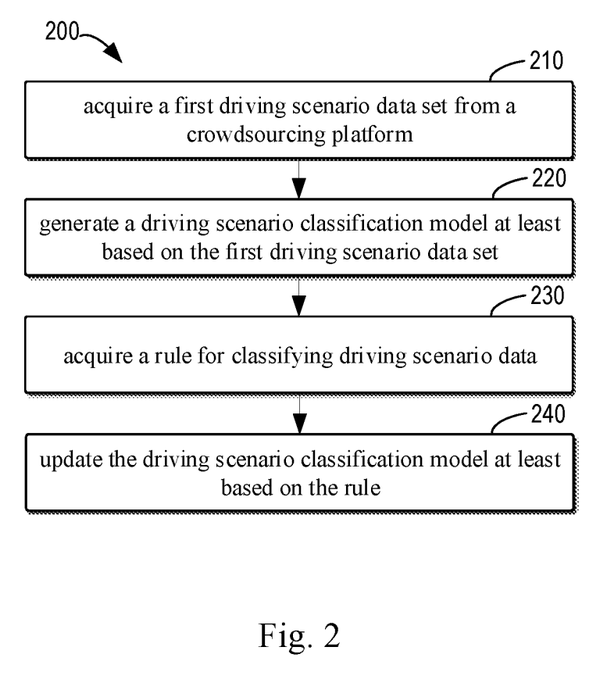
FIG. 2 is a flowchart of an exemplary method for determining a driving scenario classification model according to the embodiments of the present disclosure.

FIG. 2 is a flowchart of an exemplary method for determining a driving scenario classification model according to the embodiments of the present disclosure. For example, the method 200 may be performed by the model determining device 130 shown in FIG. 1. The actions of the method 200 will be described in detail below in combination with FIG. 1. It should be understood that the method 200 may also include an additional action not shown and/or may omit an illustrated action. The scope of the present disclosure is not limited in this respect.

At block 210, the model determining device 130 acquires a first driving scenario data set (e.g., the training sample 102 shown in FIG. 1) from the crowdsourcing platform 120. For example, the driving scenario data in the first driving scenario data set has been classified at the crowdsourcing platform 120.

In some embodiments, the driving scenario data in the first driving scenario data set may be classified into at least one of: a first category related to a geographic element, a second category related to a traffic signal, or a third category related to a driving behavior. For example, the first category may, for example, indicate a road type, a road identifier, whether there is an obstacle on the road, and a position of the obstacle, which are targeted by the driving scenario data. The second category may, for example, indicate a traffic signal light state, a traffic sign, and a type of a command from a traffic police, which are targeted by the driving scenario data. The third category may, for example, indicate a driving behavior targeted by the driving scenario data, for example, following, overtaking or lane merging. For example, the driving scenario data in the first driving scenario data set may be classified into an intersection scenario, a T-junction scenario, a red light scenario, a green light scenario, a following scenario, an overtaking scenario, a lane merging scenario, and the like. Additionally or alternatively, in some embodiments, the category of the driving scenario data in the first driving scenario data set may be a certain combination of the first category, the second category and/or the third category. For example, the category of certain driving scenario data in the first driving scenario data set may be annotated as "lane changing +intersection +obstacle being right behind the vehicle and in the same lane."

It should be understood that the above is merely some examples of the categories of the driving scenario data. In other embodiments, the driving scenario data may also be classified as per other dimensions. The embodiments of the present disclosure are not limited in this respect.

At block 220, the model determining device 130 generates the driving scenario classification model 103 at least based on the first driving scenario data set. In some embodiments, the model determining device 130 may generate the driving scenario classification model 103 using the machine learning method.

Figure 3:
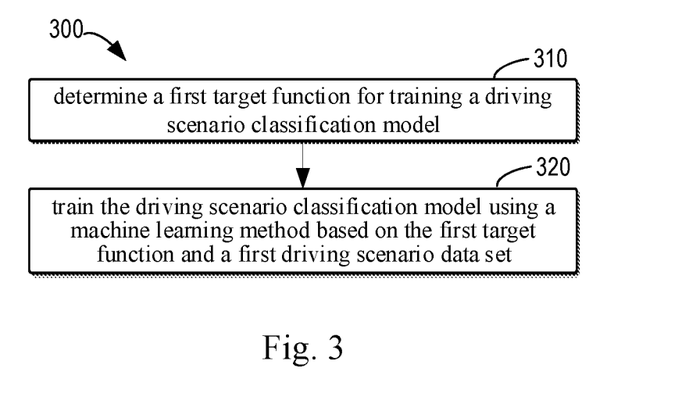
FIG. 3 is a flowchart of an exemplary method for generating a driving scenario classification model according to the embodiments of the present disclosure.

FIG. 3 is a flowchart of a method 300 for generating a driving scenario classification model according to the embodiments of the present disclosure. For example, the method 300 may be regarded as an exemplary implementation for block 220 in the method 200 shown in FIG. 2. It should be understood that the method 300 may also include an additional action not shown and/or may omit an illustrated action. The scope of the present disclosure is not limited in this respect.

As shown in FIG. 3, at block 310, the model determining device 130 may determine a first target function for training the driving scenario classification model. The first target function may be any loss function, cost function and/or objective function that is known or to be developed, which can be used to train the driving scenario classification model. At block 320, the model determining device 130 may train the driving scenario classification model based on the first target function and the first driving scenario data set. For example, based on the first target function and the first driving scenario data set, the model determining device 130 may train the driving scenario classification model by using the machine learning method, thereby determining model parameters of the driving scenario classification model.

In some embodiments, the driving scenario classification model 103 generated by the model determining device 130 may be provided to the model applying device 140, for classifying the driving scenario data 104 collected by the collection entity 110.

Returning to FIG. 2, the method 200 proceeds to block 230, the model determining device 130 acquires a rule (e.g., the rule 106 shown in FIG. 1) for classifying the driving scenario data. In some embodiments, the model determining device 130 may acquire the rule 106 from the user (e.g., the user 150 shown in FIG. 1 or an industry expert not shown in FIG. 1) formulating the rule 106.

In some embodiments, the rule 106 may be generated based on the result 105 of classifying the driving scenario data 104 collected by the collection entity 110 using the driving scenario classification model 103. For example, the model applying device 140 shown in FIG. 1 may classify the driving scenario data 104 collected by the collection entity 110 using the driving scenario classification model 103 generated by the model determining device 130, and provide the classification result 105 for the user 150. The user 150 may evaluate the classification result 105. For example, the user 150 may determine whether the classification result 105 is accurate based on the experience of the user.

Based on the evaluation on the classification result 105, the user 150 may further formulate the rule 106 for classifying the scenario data. For example, the user 150 may formulate a more specific classification rule for an inaccurately classified scenario present in the classification result 105, to make the classification result more consistent with the expectation of the user 150. In some embodiments, as shown in FIG. 1, the evaluation on the classification result 105 and the formulation for the rule 106 may be completed by the same user. Alternatively, in other embodiments, the evaluation on the classification result 105 and the formulation for the rule 106 may also be performed by different users. For example, the driving scenario classification result 105 may be provided to a user who is about to use the classified driving scenario data to implement the autonomous driving simulation. The user may evaluate the driving scenario classification result 105 and feed the evaluation back to the industry expert. The industry expert may uniformly formulate the rule 106 based on the evaluations from different users. For example, the rule 106 may indicate how should certain driving scenarios (e.g., the result of the driving scenario classification model classifying the driving scenarios is inconsistent with the result expected by the user) be classified.

Figure 4:
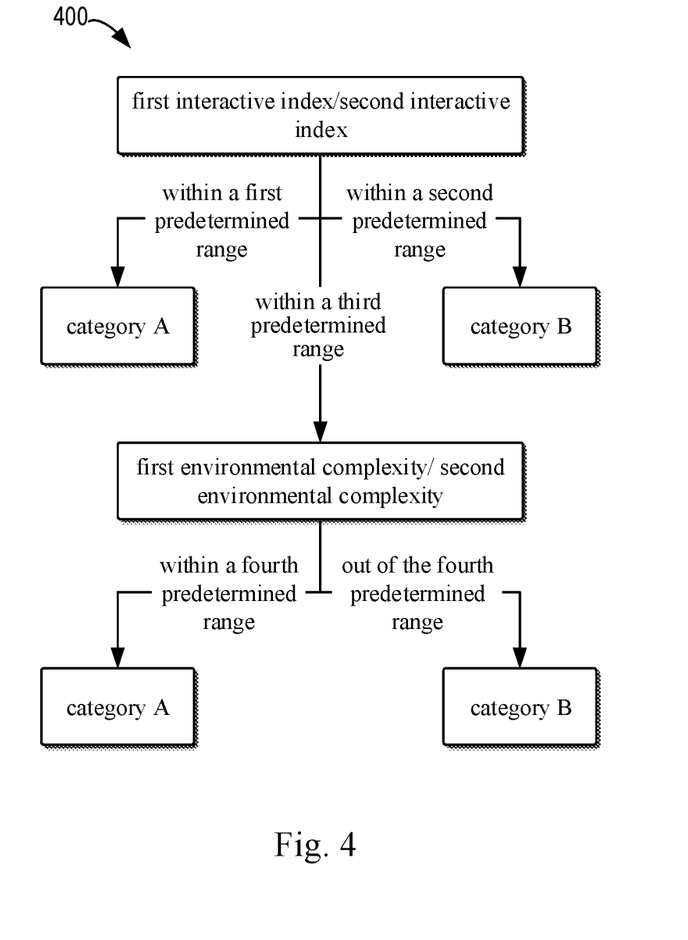
FIG. 4 is a schematic diagram of an exemplary rule for classifying driving scenario data according to the embodiments of the present disclosure.

FIG. 4 is a schematic diagram of an exemplary rule 400 for classifying driving scenario data according to the embodiments of the present disclosure. For example, the rule 400 may be regarded as an example of the rule 106 shown in FIG. 1. In the example shown in FIG. 4, it is assumed that the scenario classification model 103 classifies a certain driving scenario data 104 collected by the collection entity 110 during the collection time period as category A (e.g., the lane changing scenario), and the user 150 considers such classification is not accurate enough and considers that the scenario data 104 should be classified as category B (e.g., the intersection scenario). In this case, the user 150 or the industry expert not shown in FIG. 1 may create a specific classification rule 400 for such driving scenario data.

In some embodiments, the exemplary rule 400 may determine whether the driving scenario data 104 should be classified as category A or category B, based on a ratio of a first interactive index associated with category A to a second interactive index associated with category B.

For example, the first interactive index may be determined based on information such as the number of other moving or stationary entities (also referred to as "failure entities" herein) observed by the collection entity 110 within a certain line-of-sight range (e.g., 50 meters) during the changing of the lane, types of the failure entities, and speed and/or distance of the failure entities relative to the collection entity 110. The second interactive index may be determined based on information such as the number of moving or stationary failure entities observed by the collection entity 110 within a certain line-of-sight range (e.g., 50 meters) while the collection entity near the intersection (e.g., within a threshold distance), types of the failure entities, and speed and/or distances of the failure entities relative to the collection entity 110. The information for determining the first interactive index and the information for determining the second interactive index may be included in the driving scenario data 104 (the driving scenario data 104 may include all of the information collected by the collection entity 110 during the collection time period).

As shown in FIG. 4, if the ratio is within a first predetermined range (e.g., <1/3), the driving scenario data 104 may be classified as category B (i.e., the intersection scenario). If the ratio is within a second predetermined range (e.g., >3), the driving scenario data 104 may be classified as category A (i.e., the lane changing scenario). If the ratio is within a third predetermined range between the first predetermined range and the second predetermined range (e.g., [1/3, 3]), in some embodiments, the exemplary rule 400 may further determine whether the driving scenario data 104 should be classified as category A or category B, based on a ratio of a first environmental complexity associated with category A to a second environmental complexity associated with category B.

For example, the first environmental complexity may be determined based on information related to a road and/or a traffic signal and collected by the collection entity 110 during changing the lane, for example, the number of lanes, the number of lanes available for the lane change, lane information (e.g., a reversible lane or a speed-and-time-limit lane), and traffic light information (e.g., whether a left-turn signal light is included). The second environmental complexity may be determined based on information related to a road and/or a traffic signal and collected by the collection entity 110 while the collection entity near the intersection (e.g., within a threshold distance), for example, the number of lanes, the number of lanes available for the lane change, lane information (e.g., a reversible lane or a speed-and-time-limit lane), and traffic light information (e.g., whether a left-turn signal light is included). The information for determining the first environmental complexity and the information for determining the second environmental complexity may be included in the driving scenario data 104 (the driving scenario data 104 may include all of the information collected by the collection entity 110 during the collection time period).

As shown in FIG. 4, if the ratio is within a fourth predetermined range (e.g., <=1), the driving scenario data 104 may be classified as category B (i.e., the intersection scenario). Otherwise, the driving scenario data 104 may be classified as category A (i.e., the lane changing scenario).

The above merely shows one example of the rule for classifying the scenario data, which is generated based on a feedback of the user, according to the embodiments of the present disclosure. It should be understood that other rules are also possible. Such rules help to make the driving scenario classification result more consistent with the intention of the user, thereby improving the accuracy of the driving scenario classification.

Returning to FIG. 2, the method 200 proceeds to block 240, the model determining device 130 updates the driving scenario classification model 103 at least based on the rule 106.

Figure 5:
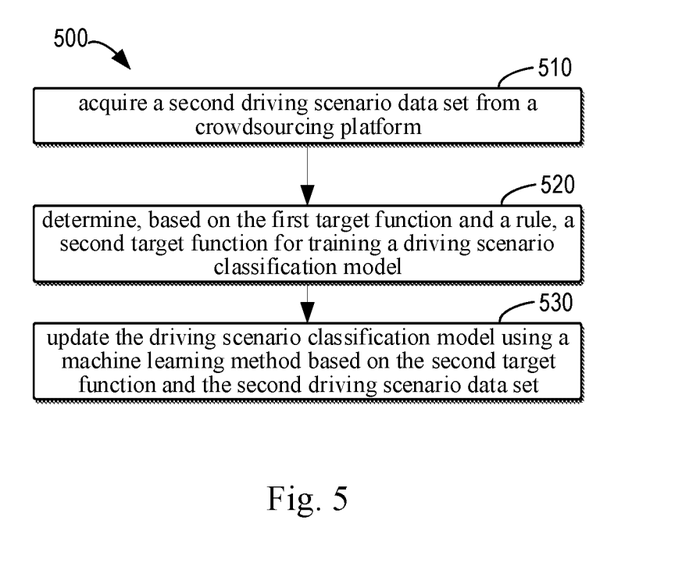
FIG. 5 is a flowchart of an exemplary method for updating a driving scenario classification model according to the embodiments of the present disclosure.

FIG. 5 is a flowchart of a method 500 for updating a driving scenario classification model according to the embodiments of the present disclosure. For example, the method 500 may be regarded as an exemplary implementation for block 240 in the method 200 shown in FIG. 2. It should be understood that the method 500 may also include an additional action not shown and/or may omit an illustrated action. The scope of the present disclosure is not limited in this respect.

As shown in FIG. 5, at block 510, the model determining device 130 may acquire a second driving scenario data set from the crowdsourcing platform 120. For example, the driving scenario data in the second driving scenario data set has been classified at the crowdsourcing platform 120. In some embodiments, the second driving scenario data set is identical to the first driving scenario data set described above. Alternatively, in other embodiments, the second driving scenario data set may also be different from the first driving scenario data set described above. For example, the second driving scenario data set may be classified at the crowdsourcing platform 120 after the first driving scenario data set has been classified. In particular, in some embodiments, the second driving scenario data set may be classified at the crowdsourcing platform 120 at least based on the rule 106. That is, the second driving scenario data set may be a training sample more consistent with the expectation of the user 150.

At block 520, the model determining device 130 may determine a second target function for training the driving scenario classification model based on the first target function and the acquired rule (e.g., the rule 106). For example, the model determining device 130 may determine, based on the rule 106, a penalty term to be added to the first target function, and generate the second target function by adding the penalty term to the first target function. In this way, the second target function can be used to train a driving scenario classification model more consistent with the expectation of the user 150.

At block 530, the model determining device 130 may update a model parameter of the driving scenario classification model 103 using the machine learning method based on the second target function and the second driving scenario data set, thereby obtaining an updated driving scenario classification model.

In this way, the embodiments of the present disclosure can effectively improve the generalization performance of the determined driving scenario classification model by combining the crowdsourcing, the rule created by the user and the machine learning technique.

The above describes the solution for determining the driving scenario classification model according to the embodiments of the present disclosure. Once being determined, the driving scenario classification model may be used to classify the driving scenario data collected by the collection entity 110.

Figure 6:
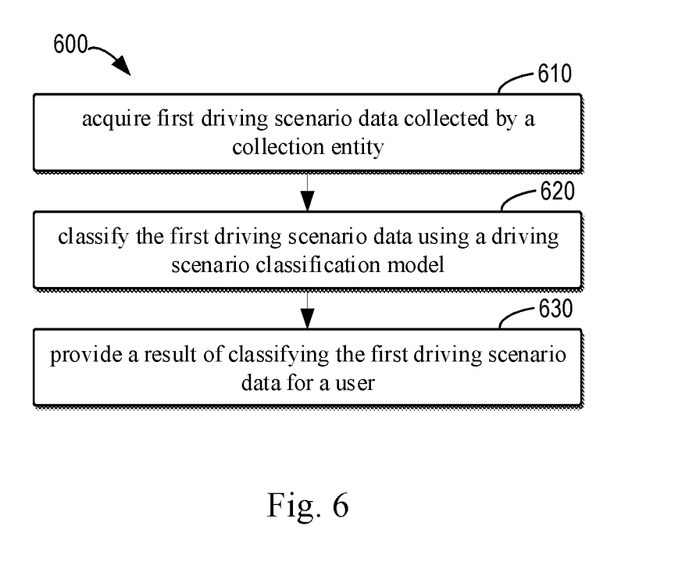
FIG. 6 is a flowchart of an exemplary method for classifying driving scenario data according to the embodiments of the present disclosure.

FIG. 6 is a flowchart of an exemplary method 600 for classifying driving scenario data according to the embodiments of the present disclosure. For example, the method 600 may be performed by the model applying device 140 shown in FIG. 1. The actions of the method 600 will be described in detail below in combination with FIG. 1. It should be understood that the method 600 may also include an additional action not shown and/or may omit an illustrated action. The scope of the present disclosure is not limited in this respect.

At block 610, the model applying device 140 acquires first driving scenario data (e.g., the driving scenario data 104 as shown in FIG. 1) collected by the collection entity 110. In some embodiments, the first driving scenario data may include all of the information collected by the collection entity 110 during the collection time period corresponding to the first driving scenario data, for example, but not limited to, information related to a road (e.g., information related to a road type, a road identifier and an obstacle on the road), information related to a traffic signal (e.g., a traffic signal light, various traffic signs, and a command from a traffic police), information related to a behavior of the collection entity 110 (e.g., following, overtaking and lane merging) and information (e.g., information related to a surrounding entity) collected by various sensors (e.g., a camera, an accelerometer and a gyroscope) installed on the collection entity 110.

At block 620, the model applying device 140 classifies the first driving scenario data using the driving scenario classification model 103. As described above, the driving scenario classification model 103 may be generated based on the classified first driving scenario data set from the crowdsourcing platform.

At block 630, the model applying device 140 may provide the user 150 with a result of classifying the first driving scenario data (e.g., the classification result 105 as shown in FIG. 1). For example, the classification result may indicate a category to which the first driving scenario data belongs, for example, an intersection scenario, a red light scenario, an overtaking scenario and a lane changing scenario. As described above, the user 150 may generate the rule 106 for classifying the driving scenario data based on the result 105, and the rule 106 may be at least used to update the driving scenario classification model 103.

In this way, the rule for classifying the driving scenario data may be generated based on the result of that the driving scenario classification model classifies the driving scenario data. By updating the driving scenario classification model based on such a rule, the subsequent driving scenario classification result may be more consistent with the intention of the user, thereby improving the accuracy of the driving scenario classification.

Figure 7:
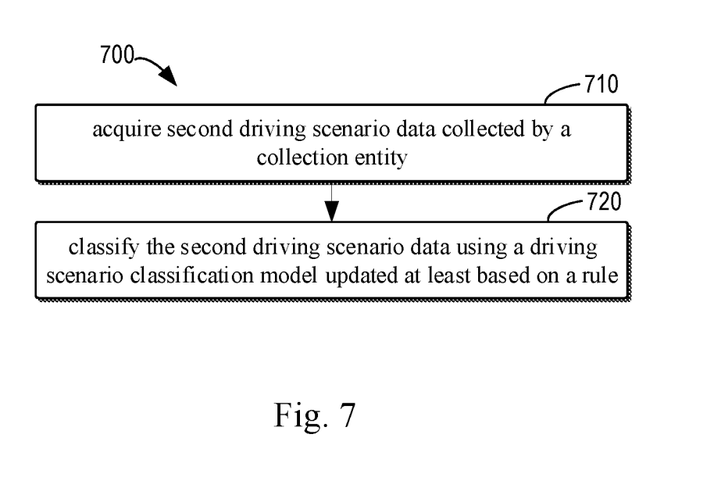
FIG. 7 is a flowchart of an exemplary method for classifying driving scenario data according to the embodiments of the present disclosure.

FIG. 7 is a flowchart of an exemplary method for classifying driving scenario data according to the embodiments of the present disclosure. For example, after the method 600 is performed, the method 700 may be performed by the model applying device 140 shown in FIG. 1. The actions of the method 700 will be described in detail below in combination with FIG. 1. It should be understood that the method 700 may also include an additional action not shown and/or may omit an illustrated action. The scope of the present disclosure is not limited in this respect.

At block 710, the model applying device 140 acquires second driving scenario data collected by the collection entity 110. For example, the second driving scenario data may be collected by the collection entity 110 after the above first driving scenario data is collected by the collection entity 110. In some embodiments, the second driving scenario data may include all of the information collected by the collection entity 110 during the collection time period corresponding to the second driving scenario data, for example, but not limited to, information related to a road (e.g., information related to a road type, a road identifier and an obstacle on the road), information related to a traffic signal (e.g., a traffic signal light, various traffic signs, and a direction of a traffic police), information related to a behavior of the collection entity 110 (e.g., following, overtaking and lane merging) and information (e.g., information related to a surrounding entity) collected by various sensors (e.g., a camera, an accelerometer and a gyroscope) installed on the collection entity 110.

At block 720, the model applying device 140 classifies the second driving scenario data using the driving scenario classification model 103 updated at least based on the rule 106. In some embodiments, the model applying device 140 may classify the second driving scenario data using the driving scenario classification model 103 that is updated based on the second driving data set from the crowdsourcing platform 120 and the rule 106. As described above, in some embodiments, the second driving scenario data set may be identical to the first driving scenario data set described above. Alternatively, in other embodiments, the second driving scenario data set may also be different from the first driving scenario data set described above. For example, the second driving scenario data set may be classified at the crowdsourcing platform 120 after the first driving scenario data set is classified at the crowdsourcing platform 120. In particular, in some embodiments, the second driving scenario data set may be classified at the crowdsourcing platform 120 at least based on the rule 106. That is, the second driving scenario data set may be a training sample more consistent with the expectation of the user 150.

In this way, the embodiments of the present disclosure classify the driving scenario data by applying the driving scenario classification model determined by combining the crowdsourcing, the rule created by the user and the machine learning technique, which can effectively improve the accuracy of the classification on the driving scenario data.

Figure 8:
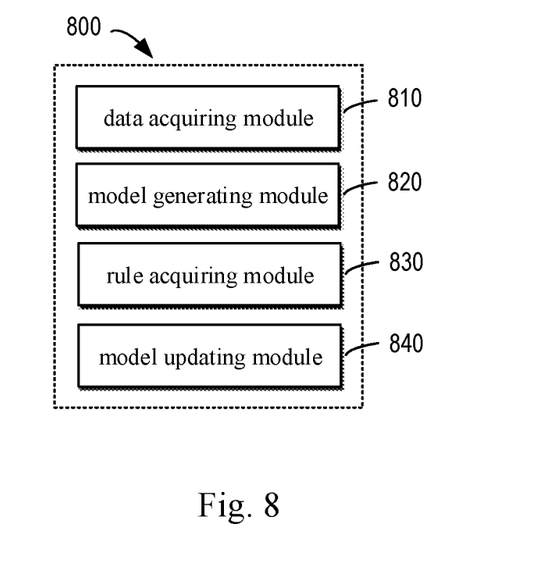
FIG. 8 is a schematic block diagram of an apparatus for determining a driving scenario classification model according to the embodiments of the present disclosure.

FIG. 8 is a schematic block diagram of an apparatus 800 for determining a driving scenario classification model according to the embodiments of the present disclosure. As shown in FIG. 8, the apparatus 800 may include a data acquiring module 810, configured to acquire a first driving scenario data set from a crowdsourcing platform, driving scenario data in the first driving scenario data set having been classified. The apparatus 800 may further include a model generating module 820, configured to generate a driving scenario classification model at least based on the first driving scenario data set, for classifying driving scenario data collected by a collection entity. The apparatus 800 may further include a rule acquiring module 830, configured to acquire a rule for classifying driving scenario data, the rule being generated based on a result of classifying the driving scenario data collected by the collection entity using the driving scenario classification model. In addition, the apparatus 800 may further include a model updating module 840, configured to update the driving scenario classification model at least based on the rule.

In some embodiments, the driving scenario data in the first driving scenario data set is classified into at least one of: a first category related to a geographic element, a second category related to a traffic signal, or a third category related to a driving behavior.

In some embodiments, the driving scenario data collected by the collection entity includes at least one of: information related to a road, information related to a traffic signal, information related to a behavior of the collection entity, or information collected by a sensor installed on the collection entity.

In some embodiments, the model generating module 820 includes: a first target function determining unit, configured to determine a first target function for training the driving scenario classification model; and a first model training unit, configured to train the driving scenario classification model using a machine learning method based on the first target function and the first driving scenario data set.

In some embodiments, the model updating module 840 includes: a data acquiring unit, configured to acquire a second driving scenario data set from the crowdsourcing platform, driving scenario data in the second driving scenario data set having been classified; a second target function determining unit, configured to determine, based on the first target function and the rule, a second target function for training the driving scenario classification model; and a second model training unit, configured to update, based on the second target function and the second driving scenario data set, the driving scenario classification model using the machine learning method.

In some embodiments, the driving scenario data in the second driving scenario data set is classified at the crowdsourcing platform at least based on the rule.

Figure 9:
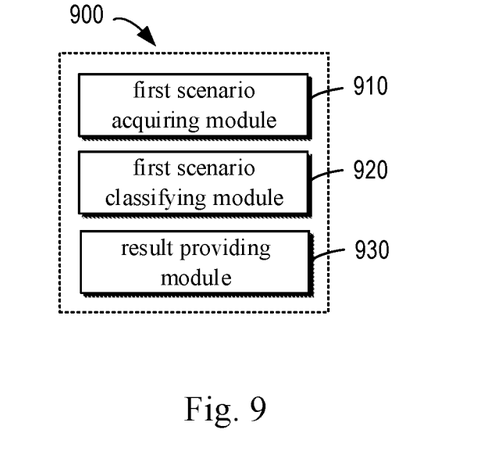
FIG. 9 is a schematic block diagram of an apparatus for classifying driving scenario data according to the embodiments of the present disclosure.

FIG. 9 is a schematic block diagram of an apparatus 900 for classifying driving scenario data according to the embodiments of the present disclosure. As shown in FIG. 9, the apparatus 900 may include: a first scenario acquiring module 910, configured to acquire first driving scenario data collected by a collection entity. The apparatus 900 may further include: a first scenario classifying module 920, configured to classify the first driving scenario data using a driving scenario classification model, the driving scenario classification model being generated based on a first driving scenario data set from a crowdsourcing platform. In addition, the apparatus 900 may further include: a result providing module 930, configured to provide a result of classifying the first driving scenario data for a user, to cause the user to generate a rule for classifying driving scenario data based on the result, the rule being at least used to update the driving scenario classification model.

In some embodiments, the first driving scenario data includes at least one of: information related to a road, information related to a traffic signal, information related to a behavior of the collection entity, or information collected by a sensor installed on the collection entity.

In some embodiments, driving scenario data in the driving scenario data set is classified into at least one of: a first category related to a geographic element, a second category related to a traffic signal, or a third category related to a driving behavior.

In some embodiments, the apparatus 900 further includes: a second scenario acquiring module, configured to acquire second driving scenario data collected by the collection entity; and a second scenario classifying module, configured to classify the second driving scenario data using the driving scenario classification model updated at least based on the rule.

In some embodiments, the driving scenario classification model is updated based on a second driving scenario data set from the crowdsourcing platform and the rule.

In some embodiments, driving scenario data in the second driving scenario data set is classified at the crowdsourcing platform at least based on the rule.

In some embodiments, at least one of the classified first driving scenario data or the classified second driving scenario data is used to train a conveyance (e.g., an unmanned vehicle, an unmanned aerial vehicle).

Figure 10:
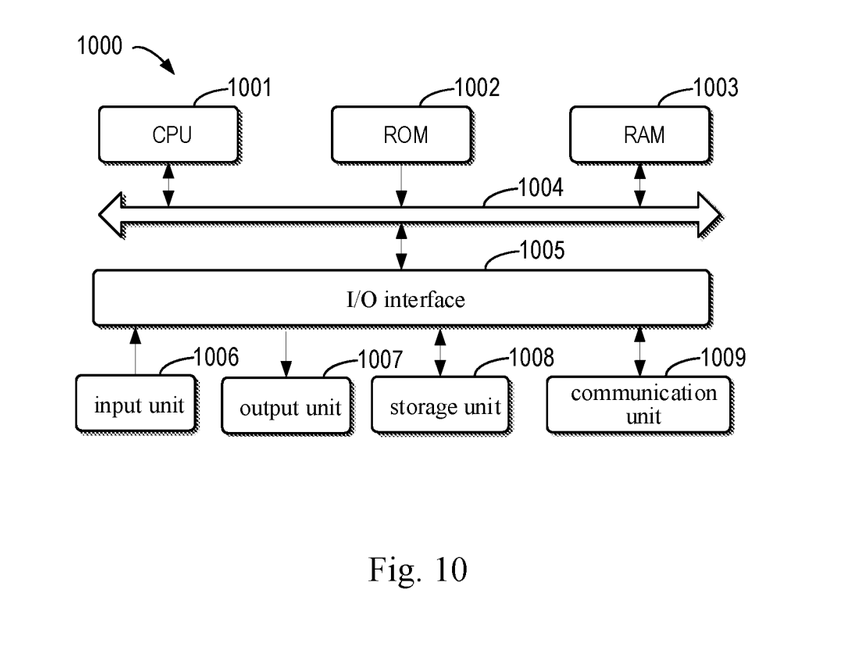
FIG. 10 is a block diagram of a computer device capable of implementing a plurality of embodiments of the present disclosure.

FIG. 10 is a schematic block diagram of an exemplary device 1000 capable of implementing the embodiments of the present disclosure. The device 1000 may be used to implement the model determining device 130 and/or the model applying device 140 shown in FIG. 1. As shown in the drawing, the device 1000 includes a central processing unit (CPU) 1001 that may perform various appropriate actions and processing in accordance with computer program instructions stored in a read only memory (ROM) 1002 or computer program instructions loaded into a random access memory (RAM) 1003 from a storage unit 1008. In the RAM 1003, various programs and data required for the operation of the device 1000 may also be stored. The CPU 1001, the ROM 1002, and the RAM 1003 are connected to each other through a bus 1004. An input/output (I/O) interface 1005 is also coupled to the bus 1004.

A plurality of components in the device 1000 are coupled to the I/O interface 1005, including: an input unit 1006, for example, a keyboard and a mouse; an output unit 1007, for example, various types of displays and speakers; the storage unit 1008, for example, a disk and an optical disk; and a communication unit 1009, for example, a network card, a modem, or a wireless communication transceiver. The communication unit 1009 allows the device 1000 to exchange information/data with other devices over a computer network such as the Internet and/or various telecommunication networks.

The processing unit 1001 performs the various methods and processes described above, for example, the methods 200, 300, 500, 600 and/or 700. For example, in some embodiments, the methods 200, 300, 500, 600 and/or 700 may be implemented as computer software programs tangibly embodied in a machine readable medium, for example, the storage unit 1008. In some embodiments, some or all of the computer programs may be loaded and/or installed onto the device 1000 via the ROM 1002 and/or the communication unit 1009. When a computer program is loaded into the RAM 1003 and executed by the CPU 1001, one or more of steps of the methods 200, 300, 500, 600 and/or 700 described above may be performed. Alternatively, in other embodiments, the CPU 1001 may be configured to perform the methods 200, 300, 500, 600 and/or 700 by any other suitable means (e.g., by means of firmware).

The functions described herein above may be performed, at least in part, by one or more hardware logic components.

For example, without limitation, illustrative types of hardware logic components that may be used include: a field programmable gate array (FPGA), an application specific integrated circuit (ASIC), an application specific standard product (ASSP), a system on a chip (SOC), a complex programmable logic device (CPLD), and the like.

Program codes for implementing the method of the present disclosure may be written in any combination of one or more programming languages. These program codes may be provided to a processor or controller of a general purpose computer, special purpose computer or other programmable data processing apparatuses such that the program codes, when executed by the processor or controller, enables the functions/operations specified in the flowcharts and/or block diagrams to be implemented. The program codes may be executed entirely on a computer, executed partially on the computer, used as a standalone software package partially executed on the computer and partially executed on a remote computer, or executed entirely on the remote computer or a server.

In the context of the present disclosure, the machine readable medium may be a tangible medium that may contain or store programs for use by or in connection with an instruction execution system, apparatus, or device. The machine readable medium may be a machine readable signal medium or a machine readable storage medium. The machine readable medium may include, but not limited to, an electronic, magnetic, optical, electromagnetic, infrared, or semiconductor system, apparatus, or device, or any suitable combination of the foregoing. More specific examples of the machine readable storage medium may include an electrical connection based on one or more wires, a portable computer disk, a hard disk, a random access memory (RAM), a read only memory (ROM), an erasable programmable read only memory (EPROM or flash memory), an optical fiber, a portable compact disk read only memory (CD-ROM), an optical storage device, a magnetic storage device, or any suitable combination of the foregoing.

In addition, although various operations are described in a specific order, this should be understood as that such operations are required to be performed in the specific order shown or in sequential order, or all illustrated operations should be performed to achieve the desired result. Multitasking and parallel processing may be advantageous in certain circumstances. Likewise, although several specific implementation details are included in the above discussion, these should not be construed as limiting the scope of the present disclosure. Certain features described in the context of separate embodiments may also be implemented in combination in a single implementation. Conversely, various features described in the context of a single implementation may also be implemented in a plurality of implementations, either individually or in any suitable sub-combination.

Although some embodiments of the present disclosure are described in language specific to structural features and/or method logic actions, it should be understood that the subject matter defined in the appended claims is not limited to the specific features or actions described above. Instead, the specific features and actions described above are merely illustrative forms of implementing the claims.

What is claimed is:

1. A method for determining a driving scenario classification model, comprising:
   acquiring a first driving scenario data set from a crowdsourcing platform, driving scenario data in the first driving scenario data set having been classified;
   generating a driving scenario classification model at least based on the first driving scenario data set;
   classifying, by the driving scenario classification model, driving scenario data collected by a collection entity to obtain a classification result;
   acquiring a rule, based on detected user input, for classifying driving scenario data, the rule being acquired in response to an inaccurately classified scenario presenting in the classification result obtained by the driving scenario classification model; and
   updating the driving scenario classification model at least based on the rule to obtain an updated driving scenario classification model,
   wherein the rule determines a classification result of a certain driving scenario based on a ratio of a first interactive index associated with a first classification result of the certain driving scenario obtained by the driving scenario classification model classifying the certain driving scenario to a second interactive index associated with a second classification result defined by the detected user input.

2. The method according to claim 1, wherein the driving scenario data in the first driving scenario data set is classified into at least one of:
   a first category related to a geographic element,
   a second category related to a traffic signal, or
   a third category related to a driving behavior.

3. The method according to claim 1, wherein the driving scenario data collected by the collection entity comprises at least one of:
   information related to a road,
   information related to a traffic signal,
   information related to a behavior of the collection entity, or
   information collected by a sensor installed on the collection entity.

4. The method according to claim 1, wherein the generating a driving scenario classification model comprises:
   determining a first target function for training the driving scenario classification model; and
   training the driving scenario classification model using a machine learning method based on the first target function and the first driving scenario data set.

5. The method according to claim 4, wherein the updating the driving scenario classification model comprises:
   acquiring a second driving scenario data set from the crowdsourcing platform, driving scenario data in the second driving scenario data set having been classified at the crowdsourcing platform at least based on the rule;
   determining, based on the first target function and the rule, a second target function for training the driving scenario classification model; and
   updating, based on the second target function and the second driving scenario data set, the driving scenario classification model using the machine learning method.

6. The method according to claim 1, wherein at least one of the classified first driving scenario data or the second classified driving scenario data is used to train a conveyance.

7. The method according to claim 4, wherein the updating the driving scenario classification model comprises:
   acquiring a second driving scenario data set from the crowdsourcing platform, driving scenario data in the second driving scenario data set having been classified at the crowdsourcing platform at least based on the rule;

determining a penalty term based on the rule, and generating a second target function by adding the penalty term to the first target function; and updating, based on the second target function and the second driving scenario data set, the driving scenario classification model using the machine learning method.

8. The method according to claim 1, wherein the first classification result of the certain driving scenario obtained by the driving scenario classification model classifying the certain driving scenario is lane changing scenario category and the classification result defined by the detected user input is an intersection scenario category, the first interactive index is determined based on a number of moving or stationary entities observed by the collection entity within a certain line-of-sight range during changing lanes, types of the stationary entities, and speed and distance of the stationary entities relative to the collection entity; and the second interactive index is determined based on the number of moving or stationary entities observed by the collection entity within the certain line-of-sight range while the collection entity is within a threshold distance from at least one of an intersection, types of the stationary entities, and speed and distances of the stationary entities relative to the collection entity.

9. A computer readable storage medium, storing a computer program, wherein the computer program, when executed by a processor, implements the method according to claim 1.

10. A computer-implemented method for classifying driving scenario data, comprising:

acquiring first driving scenario data collected by a collection entity;

classifying the first driving scenario data using a driving scenario classification model, the driving scenario classification model being generated by using a machine learning method based on a first driving scenario data set from a crowdsourcing platform; and providing a result of classifying the first driving scenario data;

generating a rule, based on detected user input, for classifying driving scenario data in response to an inaccurately classified scenario presenting in the result obtained by the driving scenario classification model; wherein the driving scenario classification model is updated based on a second driving scenario data set from the crowdsourcing platform and the rule, to obtain an updated driving scenario classification model, driving scenario data in the second driving scenario data set is classified at the crowdsourcing platform according to the rule; and classifying second driving scenario data using the updated driving scenario classification model to obtain a classification result of the second driving scenario data, wherein the rule determines a classification result of a certain driving scenario based on a ratio of a first interactive index associated with a first classification result of the certain driving scenario obtained by the driving scenario classification model classifying the certain driving scenario to a second interactive index associated with a second classification result defined by the detected user input.

11. The method according to claim 10, wherein the first driving scenario data comprises at least one of:

information related to a road, information related to a traffic signal, information related to a behavior of the collection entity, or information collected by a sensor installed on the collection entity.

12. The method according to claim 10, wherein driving scenario data in the driving scenario data set is classified into at least one of:

a first category related to a geographic element, a second category related to a traffic signal, or a third category related to a driving behavior.

13. The method according to claim 10, further comprising:

applying, in a driving simulation system, the second driving scenario data and the classification result thereof obtained by the updated driving scenario classification model, to evaluate an autonomous driving algorithm.

14. An apparatus for classifying driving scenario data, comprising:

at least one processor; and a memory storing instructions, the instructions when executed by the at least one processor, cause the at least one processor to perform the method of claim 6.

15. The apparatus according to claim 14, wherein the first driving scenario data comprises at least one of:

information related to a road, information related to a traffic signal, information related to a behavior of the collection entity, or information collected by a sensor installed on the collection entity.

16. The apparatus according to claim 14, wherein driving scenario data in the driving scenario data set is classified into at least one of:

a first category related to a geographic element, a second category related to a traffic signal, or a third category related to a driving behavior.

17. A computer readable storage medium, storing a computer program, wherein the computer program, when executed by a processor, implements the method according to claim 10.

18. An apparatus for determining a driving scenario classification model, comprising:

at least one processor; and a memory storing instructions, the instructions when executed by the at least one processor, cause the at least one processor to perform operations, the operations comprising:

acquiring a first driving scenario data set from a crowdsourcing platform, driving scenario data in the first driving scenario data set having been classified;

generating a driving scenario classification model at least based on the first driving scenario data set;

classifying, by the driving scenario classification model, driving scenario data collected by a collection entity to obtain a classification result;

acquiring a rule, based on detected user input, for classifying driving scenario data, the rule being acquired in response to an inaccurately classified scenario presenting in the classification result obtained by the driving scenario classification model; and updating the driving scenario classification model at least based on the rule to obtain an updated driving scenario classification model, wherein the rule determines a classification result of a certain driving scenario based on a ratio of a first interactive index associated with a first classification result of the certain driving scenario obtained by the driving scenario classification model classifying the certain driving scenario to a second interactive index associated with a second classification result defined by the detected user input.

19. The apparatus according to claim 18, wherein the driving scenario data in the first driving scenario data set is classified into at least one of:
    a first category related to a geographic element,
    a second category related to a traffic signal, or
    a third category related to a driving behavior.

20. The apparatus according to claim 18, wherein the driving scenario data collected by the collection entity comprises at least one of:
    information related to a road,
    information related to a traffic signal,
    information related to a behavior of the collection entity, or
    information collected by a sensor installed on the collection entity.

21. The apparatus according to claim 18, wherein the generating a driving scenario classification model comprises:
    determining a first target function for training the driving scenario classification model; and
    training the driving scenario classification model using a machine learning method based on the first target function and the first driving scenario data set.

22. The apparatus according to claim 21, wherein the updating the driving scenario classification model comprises:
    acquiring a second driving scenario data set from the crowdsourcing platform, driving scenario data in the second driving scenario data set having been classified at the crowdsourcing platform at least based on the rule;
    determining, based on the first target function and the rule, a second target function for training the driving scenario classification model; and
    updating, based on the second target function and the second driving scenario data set, the driving scenario classification model using the machine learning method.

* * * * *